United States Patent
Seo et al.

(10) Patent No.: US 7,589,012 B1
(45) Date of Patent: Sep. 15, 2009

(54) METHOD FOR FABRICATING SEMICONDUCTOR MEMORY DEVICE

(75) Inventors: Hye Jin Seo, Icheon-si (KR); Yong Seok Eun, Seongnam-Si (KR); Su Ho Kim, Icheon-si (KR); An Bae Lee, Seoul (KR)

(73) Assignee: Hynix Semiconductor Inc., Icheon-Si (KR)

( * ) Notice: Subject to any disclaimer, the term of this patent is extended or adjusted under 35 U.S.C. 154(b) by 0 days.

(21) Appl. No.: 12/164,848

(22) Filed: Jun. 30, 2008

(30) Foreign Application Priority Data

Mar. 5, 2008 (KR) ...................... 10-2008-0020689

(51) Int. Cl.
*H01L 21/4763* (2006.01)
(52) U.S. Cl. ...................................... 438/618
(58) Field of Classification Search ................. 438/262, 438/618
See application file for complete search history.

(56) References Cited

U.S. PATENT DOCUMENTS

| 4,657,628 | A | * | 4/1987 | Holloway et al. | ........... 438/647 |
| 6,521,548 | B2 | | 2/2003 | Jeng | |
| 2005/0186755 | A1 | | 8/2005 | Smythe et al. | |

\* cited by examiner

*Primary Examiner*—Leonardo Andujar
*Assistant Examiner*—Monica D Harrison
(74) *Attorney, Agent, or Firm*—Marshall, Gerstein & Borun LLP

(57) ABSTRACT

Disclosed herein is a method for fabricating a semiconductor memory device that can prevent oxidation of bit lines when forming an interlayer dielectric for isolating the bit lines. The bit line is formed on a semiconductor substrate where an underlying structure is formed. A silicon on dielectric (SOD) layer is formed on the resulting structure where the bit line is formed. A heat treatment can be performed on the SOD layer with a partial pressure ratio of water vapor ($H_2O$) to hydrogen ($H_2$) in a range of about $1 \times 10^{-11}$ to about 1.55 at a temperature in a range of about 600° C. to about 1,100° C.

7 Claims, 4 Drawing Sheets

METHOD FOR FABRICATING SEMICONDUCTOR MEMORY DEVICE

CROSS-REFERENCE TO RELATED APPLICATION

Priority to Korean patent application number 10-2008-0020689, filed on Mar. 5, 2008, the disclosure of which is incorporated by reference in its entirety, is claimed.

BACKGROUND OF THE INVENTION

The present invention relates generally to a method for fabricating a semiconductor device, and more particularly, to a method for forming an interlayer dielectric for isolating bit lines from each other.

As the integration level of a semiconductor device increases and the size of devices is reduced, a gap-fill of a dielectric layer for isolating the devices or conductive layers becomes more difficult. Polysilazane (PZT) used for a gap-fill of a minute region has been recently introduced. The PZT is also called silicon on dielectric (SOD), and has a good reflow property to thus easily gap-fill a minute region.

Unlike a high-density plasma (HDP) oxide layer deposited using chemical vapor deposition (CVD), the SOD layer is coated using coating equipment and then cured at a predetermined temperature using curing equipment so that silicon is transformed to silicon oxide ($SiO_2$). That is, the SOD layer is coated, and then heat treated in a vapor atmosphere to replace silicon (Si)-nitrogen (N)-hydrogen (H) atoms with silicon oxide ($SiO_2$). In this process, properties of the silicon oxide ($SiO_2$) layer vary with curing conditions. Since the property of the silicon oxide ($SiO_2$) greatly affects a following wet etching process, it is very important to select an appropriate curing condition for forming a more stable silicon oxide ($SiO_2$) layer.

In addition, the SOD layer is being used instead of the HDP oxide layer as an interlayer dielectric for isolating bit lines or isolating bit lines and other conductive layers in view of the gap-fill characteristic. In order to form the interlayer dielectric using the SOD layer, the SOD is coated to a predetermined thickness on a semiconductor substrate where bit lines are formed, and cured in a wet atmosphere using water vapor ($H_2O$) or a dry atmosphere using oxygen ($O_2$). If a furnace is used to cure the SOD layer, the curing is performed at a flow rate ratio of hydrogen ($H_2$) gas to oxygen ($O_2$) gas of 1.85 or less in order to prevent explosion due to non-reacted hydrogen ($H_2$) gas remaining at a high temperature. Therefore, the curing of the SOD layer is performed in a relatively rich oxygen ($O_2$) gas atmosphere.

However, unlike the case of filling trenches with the SOD layer to form a device isolation layer, in the gap-fill process after a bit line forming process, underlying bit lines are easily oxidized by oxygen ($O_2$) during the curing of the SOD layer because the bit lines are formed of metal, such as tungsten (W), which is susceptible to oxidation. The oxidation of the bit lines increases the resistance of the bit lines, deteriorates electrical characteristic of a device, and thereby reducing the yield rate.

SUMMARY OF THE INVENTION

Disclosed herein are embodiments directed to methods for fabricating a semiconductor memory device that prevent oxidation of a bit line while forming an interlayer dielectric for isolating the bit line from a conductive layer using a SOD layer having a good gap-fill characteristic so as to increase reliability of a device and increase the yield rate.

In one embodiment, a method for fabricating a semiconductor memory device includes: forming a bit line on a semiconductor substrate; forming a silicon on dielectric (SOD) layer on the resulting structure where the bit line is formed; and performing a heat treatment on the SOD layer with a partial pressure ratio of water vapor ($H_2O$) to hydrogen ($H_2$) in a range of about $1\times10^{-11}$ to about 1.55. The heat treatment can be performed at a temperature in a range of about 600° C. to about 1,100° C.

The bit line can be formed of metal such as tungsten (W).

The heat treatment can be performed using a rapid thermal process (RTP).

After performing the heat treatment, the semiconductor substrate can be cleaned using a sulfuric acid ($H_2SO_4$) solution.

In another embodiment, a method for fabricating a semiconductor memory device includes: forming a bit line on a semiconductor substrate; forming a silicon on dielectric (SOD) layer on the resulting structure where the bit line is formed; and densifying the SOD layer using plasma with a partial pressure ratio of water vapor ($H_2O$) to hydrogen ($H_2$) in a range of about $1\times10^{-11}$ to about 1.55. The SOD layer can be densified at a temperature in a range of about 150° C. to about 400° C.

The bit line can be formed of metal such as tungsten (W).

After densifying the SOD layer, the semiconductor substrate can be cleaned using a sulfuric acid ($H_2SO_4$) solution.

DESCRIPTION OF SPECIFIC EMBODIMENTS

Hereinafter, a method for fabricating a semiconductor memory device will be described in detail with reference to the accompanying drawings.

An embodiment of the present invention can provide a method for obtaining reliability of a device and increasing yield rate by preventing oxidation of underlying bit lines when forming an interlayer dielectric for isolating the bit lines or isolating the bit lines and a storage node contact using a SOD layer of a good gap-fill characteristic.

Figure 1:
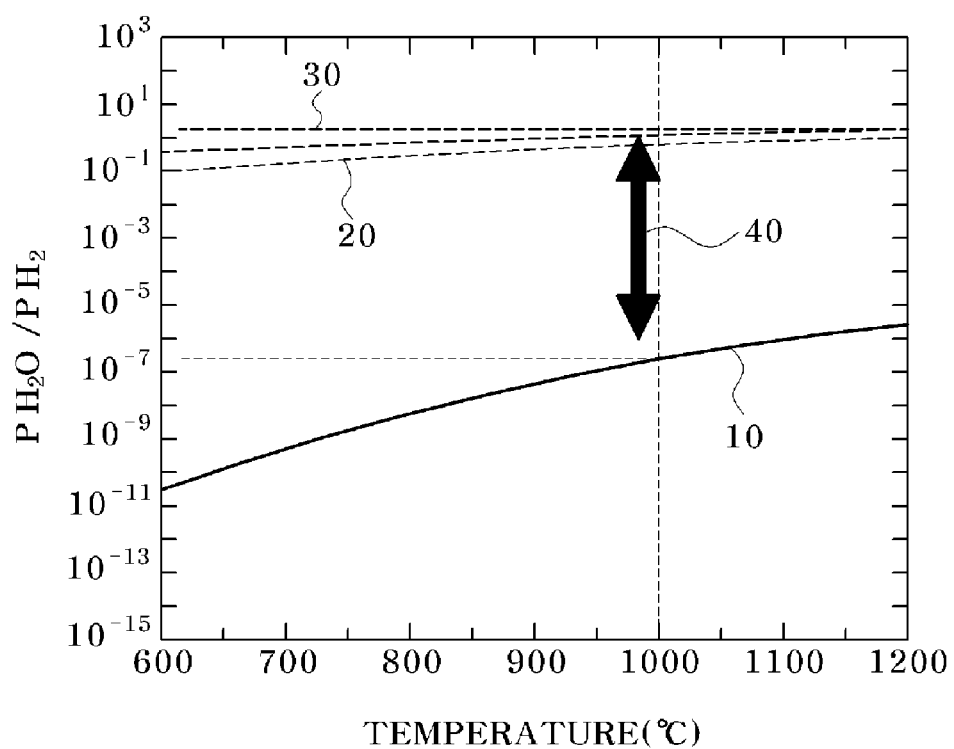
FIG. 1 illustrates a graph that shows partial pressure ratio of water vapor ($H_2O$) to hydrogen ($H_2$) versus temperature when a semiconductor substrate is coated with a SOD layer and cured.

FIG. 1 illustrates a graph that shows partial pressure ratio of water vapor ($H_2O$) to hydrogen ($H_2$) versus temperature when a semiconductor substrate is coated with a SOD layer and cured.

In FIG. 1, a reference numeral 10 represents generation of a silicon oxide ($SiO_2$) layer caused by reaction between silicon (Si) contained in the SOD layer and water vapor ($H_2O$). Reference numerals 20 and 30 represent generation of tungsten oxide ($WO_3$) caused by reaction between tungsten (W) and water vapor ($H_2O$). Reference numeral 40 represents a region of intersection of pressure and temperature where a silicon oxide ($SiO_2$) layer is formed due to reaction between silicon (Si) and water vapor ($H_2O$) and oxidation of tungsten (W) does not occur.

Referring to FIG. 1, only when a partial pressure ratio of water vapor ($H_2O$) to hydrogen ($H_2$) and a temperature are within a specific range (refer to a reference numeral 40), the silicon oxide ($SiO_2$) layer is formed from the SOD layer due to selective oxidation of silicon (Si) without oxidation of a bit line.

Therefore, by controlling the partial pressure ratio of water vapor ($H_2O$) to hydrogen ($H_2$) and a temperature, it is possible to cure the SOD layer without oxidation of the bit line, and thus improve the characteristics of a semiconductor device.

Figure 2A:
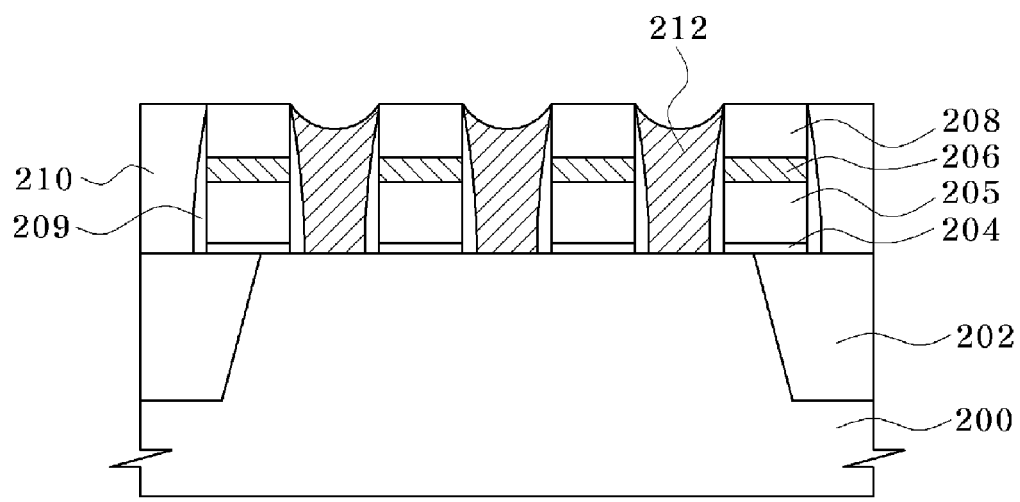
FIGS. 2A to 4B illustrate a method for fabricating a semiconductor memory device according to an embodiment of the present invention.
Figure 2B:
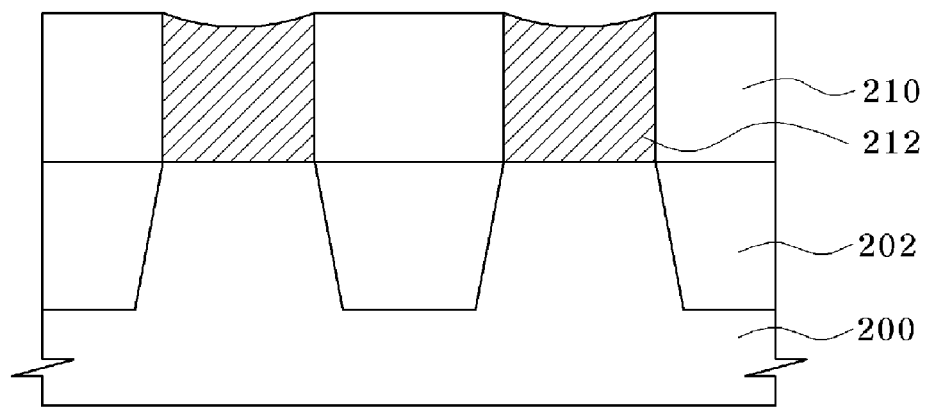
Figure 3A:
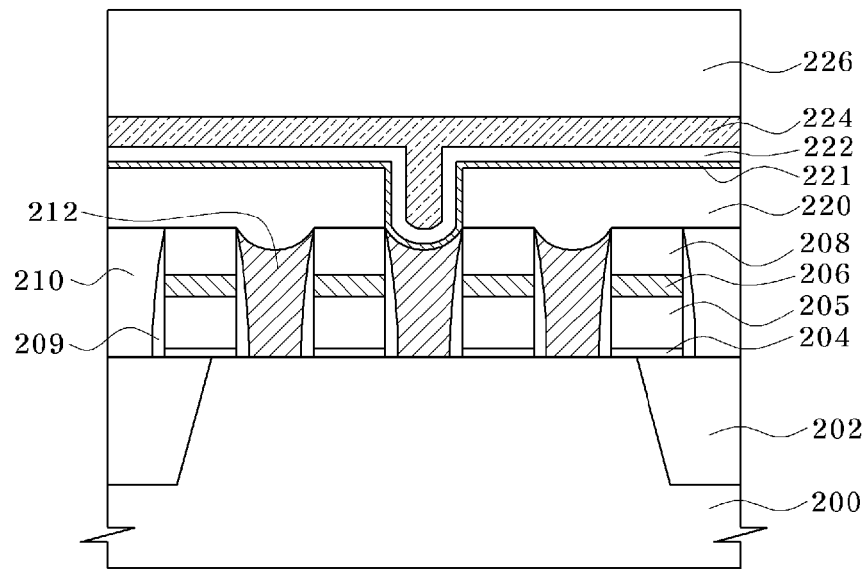
Figure 3B:
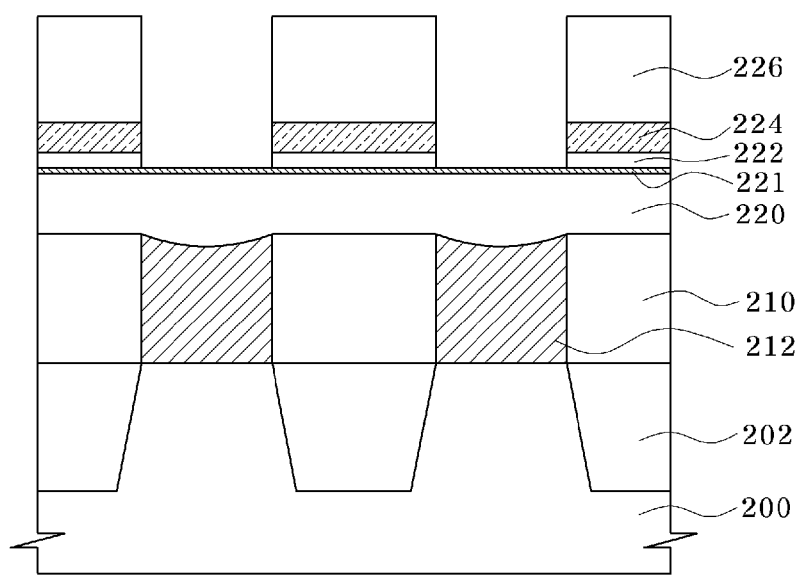
Figure 4A:
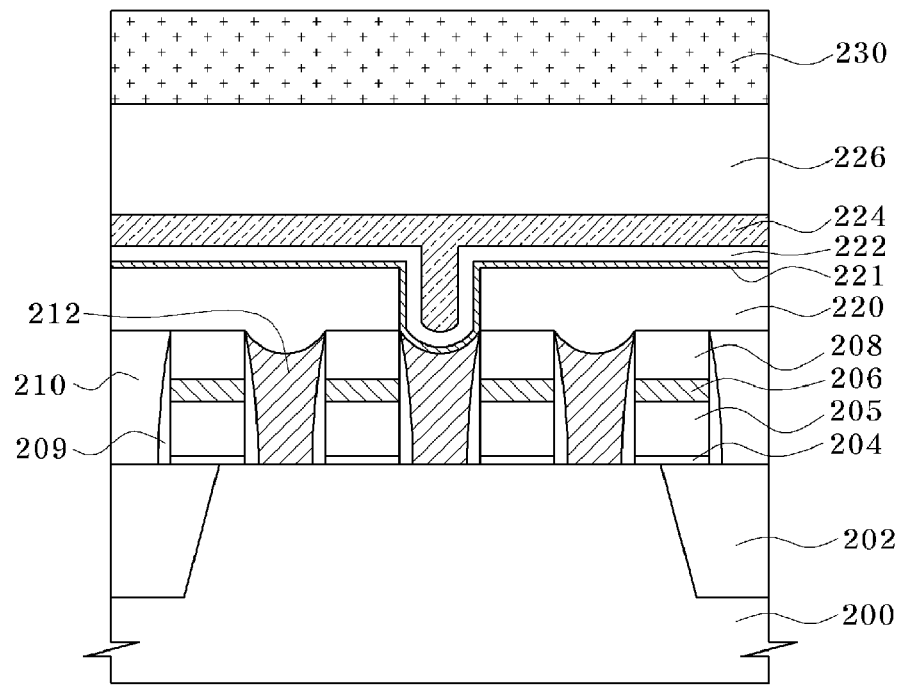
Figure 4B:
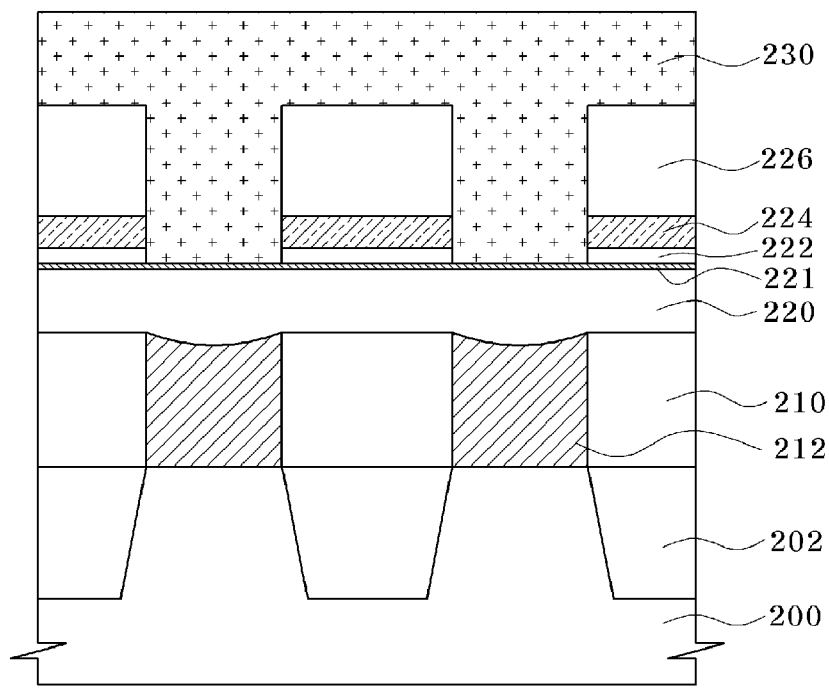

FIGS. 2A to 4B illustrate a method for fabricating a semiconductor memory device according to an embodiment. FIGS. 2A, 3A and 4A illustrate cross-sectional views taken along a bit line direction, and FIGS. 2B, 3B and 4B illustrate cross-sectional views taken along a word line direction.

Referring to FIGS. 2A and 2B, a device isolation layer 202 for isolating devices is formed in a semiconductor substrate 200 using, for example, a shallow trench isolation (STI) method. A first interlayer dielectric layer 210 is formed by depositing a dielectric layer such as an oxide layer on the semiconductor substrate 200. A cell transistor, which includes a gate, a source, and a drain, is formed in an active region that is defined by the device isolation layer. The gate can include a gate dielectric layer 204, a polysilicon layer 205, a metal silicide layer 206, and a hard mask 208 that are stacked. The gate can be a recess-type gate for improving the characteristic of the device through an increase in an effective channel length. A spacer 209 including a dielectric layer can be formed at a sidewall of the gate.

A contact hole for connection between the source/drain of the transistor and a bit line is formed by etching the first interlayer dielectric layer 210, and then a landing plug 212 is formed by filling the contact hole with a conductive layer such as a polysilicon layer or a metal layer. Referring to FIGS. 3A and 3B, a second interlayer dielectric layer 220 is formed on the semiconductor substrate 200 including the landing plug 212, and then a bit line contact hole (shown as subsequently filled, as described below) exposing the landing plug 212 is formed by etching a portion of the second interlayer dielectric layer 220.

Barrier layers 221 and 222 can be formed by depositing titanium (Ti) and titanium nitride (TiN), e.g., sequentially, on an inner wall of the bit line contact hole. The barrier layer 221 improves adhesion between the landing plug 212 and the barrier layer 222, and the barrier layer 222 prevents reaction between the barrier layer 221 and tungsten (W) of a bit line to be formed later. The barrier layers 221 and 222 can be formed of different materials.

A bit line conductive layer 224 can be formed by depositing tungsten (W) on the resulting structure including the barrier layers 221 and 222. A hard mask 226 can be formed on the bit line conductive layer 224. The hard mask 226 protects the bit line conductive layer 224 during a photolithography process for depositing, for example, a nitride layer so as to define the bit line. The hard mask 226 and the bit line conductive layer 224 can be patterned, e.g., through a photolithography process, using a mask for a bit line so as to form a bit line stack.

Referring to FIGS. 4A and 4B, the resulting structure of the semiconductor substrate 200 including the bit line stack can be coated with, for example, a SOD layer of a predetermined thickness, in order to form a third dielectric layer 230 for isolating bit line stacks or isolating the bit line stack and a storage node contact to be formed later. Next, annealing can be performed, preferably under the following conditions in order to replace the coated SOD layer with a silicon oxide layer.

The annealing process for the SOD layer can be performed using a rapid thermal process (RTP) or using plasma. As described above, in order to replace the SOD layer with the silicon oxide layer while preventing oxidation of the bit line conductive layer 224, the annealing preferably is performed in a specific range of a temperature, and also preferably with a preferred vapor to hydrogen partial pressure ratio. In a preferred embodiment, when the SOD layer is annealed using the RTP, as shown in FIG. 1, the water vapor ($H_2O$) to hydrogen ($H_2$) partial pressure ratio preferably is controlled to a value in a range of approximately $1 \times 10^{-11}$ to approximately 1.55, and further the temperature is preferably controlled to about 1,100° C. or less, preferably in a range of about 600° C. to about 1,100° C.

When the SOD layer is annealed using plasma, the annealing process may be performed at a lower temperature. In a preferred embodiment, when annealing the SOD layer using plasma, temperature of a chamber may be maintained at about 400° C. or less, preferably in a range of about 150° C. to about 400° C. The partial pressure ratio of water vapor ($H_2O$) to hydrogen ($H_2$) preferably is controlled to a value in a range of about $1 \times 10^{-11}$ to about 1.55, similar to the ratio preferred using RTP.

When the SOD layer is annealed under the above-described preferred conditions of the temperature and the partial pressure ratio of water vapor ($H_2O$) to hydrogen ($H_2$), silicon (Si) in the SOD layer can be selectively oxidized without the oxidation of tungsten (W) in the bit line to replace the SOD layer with the silicon oxide ($SiO_2$) layer. This is because tungsten (W) and silicon (Si) have different degrees of oxidation from each other.

During the annealing process, reaction of water vapor ($H_2O$) and tungsten (W) may produce a gaseous contaminant tungsten oxide hydrate ($WO_2(OH)_2$), thereby contaminating the semiconductor substrate and equipment. To prevent this, a cleaning process may be performed on the resulting structure using a diluted sulfuric acid ($H_2SO_4$) solution after the annealing process.

According to embodiments, when an interlayer dielectric layer is formed in order to isolate bit lines from each other or isolate bit lines and other conductive layers, a SOD layer of a good gap-fill property may be coated and heat-treated in a specific range of temperature and vapor to hydrogen partial pressure. As such, it is possible to form the interlayer dielectric layer without oxidation of the bit lines, which can improve reliability of the device.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:
    forming a bit line on a semiconductor substrate;
    forming a silicon-on-dielectric layer on the resulting structure where the bit line is formed; and
    performing a heat treatment on the silicon-on-dielectric layer with a partial pressure ratio of water vapor to hydrogen in a range of about $1 \times 10^{-11}$ to about 1.55 at a temperature in a range of about 600° C. to about 1,100° C.

2. The method of claim 1, further comprising forming the bit line of metal.

3. The method of claim 1, further comprising performing the heat treatment using a rapid thermal process (RTP).

4. The method of claim 1, further comprising, after performing the heat treatment, cleaning the semiconductor substrate using a sulfuric acid solution.

5. A method for fabricating a semiconductor device, the method comprising:
   forming a bit line on a semiconductor substrate;
   forming a silicon-on-dielectric layer on the resulting structure where the bit line is formed; and
   densifying the silicon-on-dielectric layer using plasma with a partial pressure ratio of water vapor to hydrogen in a range of about $1 \times 10^{-11}$ to about 1.55 at a temperature in a range of about 150° C. to about 400° C.

6. The method of claim 5, further comprising forming the bit line of metal.

7. The method of claim 5, further comprising, after densifying the silicon-on-dielectric layer, cleaning the semiconductor substrate using a sulfuric acid solution.

* * * * *